United States Patent [19]
Pezzini

[11] Patent Number: 5,491,662
[45] Date of Patent: Feb. 13, 1996

[54] MICROCONTROLLER MEMORY CELL CURRENT READING METHOD

[75] Inventor: Saverio Pezzini, Vimercate, Italy

[73] Assignee: SGS-Thomson Microelectronics S.r.l., Agrate Brianza, Italy

[21] Appl. No.: 266,939

[22] Filed: Jun. 27, 1994

[30] Foreign Application Priority Data

Jun. 28, 1993 [EP] European Pat. Off. .............. 93830278

[51] Int. Cl.⁶ .................................................. G11C 16/06
[52] U.S. Cl. .................... 365/189.03; 365/201; 365/191; 365/210; 365/189.07
[58] Field of Search .......................... 365/189.01, 189.02, 365/189.03, 201, 191, 210, 189.07

[56] References Cited

U.S. PATENT DOCUMENTS

| | | | |
|---|---|---|---|
| 4,958,324 | 9/1990 | Devin . | |
| 5,181,205 | 1/1993 | Kertis | 365/201 |
| 5,291,448 | 3/1994 | Conan | 365/201 |
| 5,331,594 | 7/1994 | Hotta | 365/201 |
| 5,355,341 | 10/1994 | Gaultier et al. | 365/201 |

FOREIGN PATENT DOCUMENTS 0318363  5/1989  European Pat. Off. ........ G11C 29/00

OTHER PUBLICATIONS

IEICE Transactions, vol. E75–C, No. 4, Apr. 1992, Tokyo, Japan, pp. 472–479, Kuo, et al., "A 512Kb Flash EEPROM Embedded In A 32-b Microcontroller".

1991 Symposium On VLSI Circuits, Digest of Technical Papers, May 1991, Oiso, Japan, pp. 87–88, Kuo, et al., "A 512Kb Flash Eeprom For A 32 bit Microcomputer".

*Primary Examiner*—Viet Q. Nguyen
*Attorney, Agent, or Firm*—David M. Driscoll; James H. Morris

[57] ABSTRACT

A method is provided for directly reading the current of cells of a memory forming part of a microcontroller by performing a write operation of the cells and using the existing cell programming logic. For this purpose, the programming voltage supply line is supplied with a low voltage (e.g., 1 V); the word line of the cell for reading is enabled; and a write instruction of a data item having a predetermined logic level (e.g., zero) is performed at the bit corresponding to the cell for reading. By providing an additional pass transistor connected to each reference bit line (RBL) and an additional reference cell enabling line (REF-EN), the reference cells may also be read directly.

29 Claims, 2 Drawing Sheets

MICROCONTROLLER MEMORY CELL CURRENT READING METHOD

BACKGROUND OF THE INVENTION

1. Field of the Invention

The present invention relates to a method of reading the current of microcontroller memory cells.

2. Discussion of the Related Art

Most single memories, which are integrated in a chip housing only the memory, have pins for measuring the current of memory cells. A voltage of roughly 1 V is applied to a pin to measure the current of each cell. Such a method is very useful for checking and engineering the memory.

At present, however, the above method is not applicable to microcontrollers having nonvolatile EPROM or flash-EEPROM memories, because it is generally impossible to provide them with numerous additional pins which would be required, or to perform the cell reading function using the existing pins on the microcontroller, since the pins already perform diverse functions. Moreover, the same memory configuration may be used for designing various differently structured microcontrollers, so that a solution suitable for one is not necessarily suitable for others.

SUMMARY OF THE INVENTION

It is an object of the present invention to provide a method designed to overcome the aforementioned drawbacks, and which provides for directly reading the current of even microcontroller integrated memory cells.

According to the present invention, a method of measuring current through memory cells in a microcontroller includes steps of supplying a low voltage to a programming voltage supply line of the memory, performing a write operation to a selected cell of the memory, and measuring current flow through the selected cell.

The low voltage is preferably about 1 volt, the low voltage being significantly less than the programming voltage which is typically about 5.5 volts–7 volts. Preferably, the memory array has a cell enable line and the method includes the step of enabling the cell enabling line before performing a write operation. In a preferred embodiment, the memory cells include data cells and reference cells where the step of enabling the cell enable line includes the step of generating a control signal to selectively enable a data enabling line and a reference enabling line.

The current can be measured either through a programming pin or through a separate external connecting pin. If a programming pin is used, the voltage is supplied to the programming pin, and a write switch, which is located between the programming pin and the programming voltage supply line, is enabled. The current flow is then measured through the programming pin, typically with an ammeter. When an external connecting pin is used, a direct reading switch is provided between the external connecting pin and the programming voltage supply line. In this case, the supplying step includes supplying the voltage to the external connecting pin, then the direct reading switch, and measuring the current through the external connecting pin.

The method of the present invention exploits the existing memory programming logic with direct analog access to the memory, wherein, for reading a cell, a write instruction is performed by selecting a cell for reading and applying to the drain terminal of the cell a low voltage as opposed to a high write voltage. This way, the selected cell is not written, but the current flowing through the cell is measurable without damaging the stored data.

A microcontroller, according to the present invention, has a programming voltage supply line, a memory array having a number of memory cells coupled to the programming voltage supply line, means for writing to predetermined cells in the memory, and means for supplying a voltage to the programming supply line and for detecting current flow in a selected memory cell.

As noted above, the voltage supply and the current reading can be done through a programming pin or through an external connecting pin.

The memory array preferably has data cells and reference cells which are respectively connected to data bit lines and reference bit lines. The microcontroller further has a data input line, a data cell read enable line, a reference cell read enable line line, a reference pass transistor intermediate the programming voltage supply line and the reference bit line, and a logic circuit connecting the pass transistor, the reference cell read enable line, and the data input line. A memory control logic unit is also preferably provided and has storage elements which are coupled to the data cell read enable line and the reference cell read enable line for storing enabling data.

BRIEF DESCRIPTION OF THE DRAWINGS

Two embodiments of the present invention will be described by way of example with reference to the accompanying drawings, in which.

DETAILED DESCRIPTION

Figure 1:
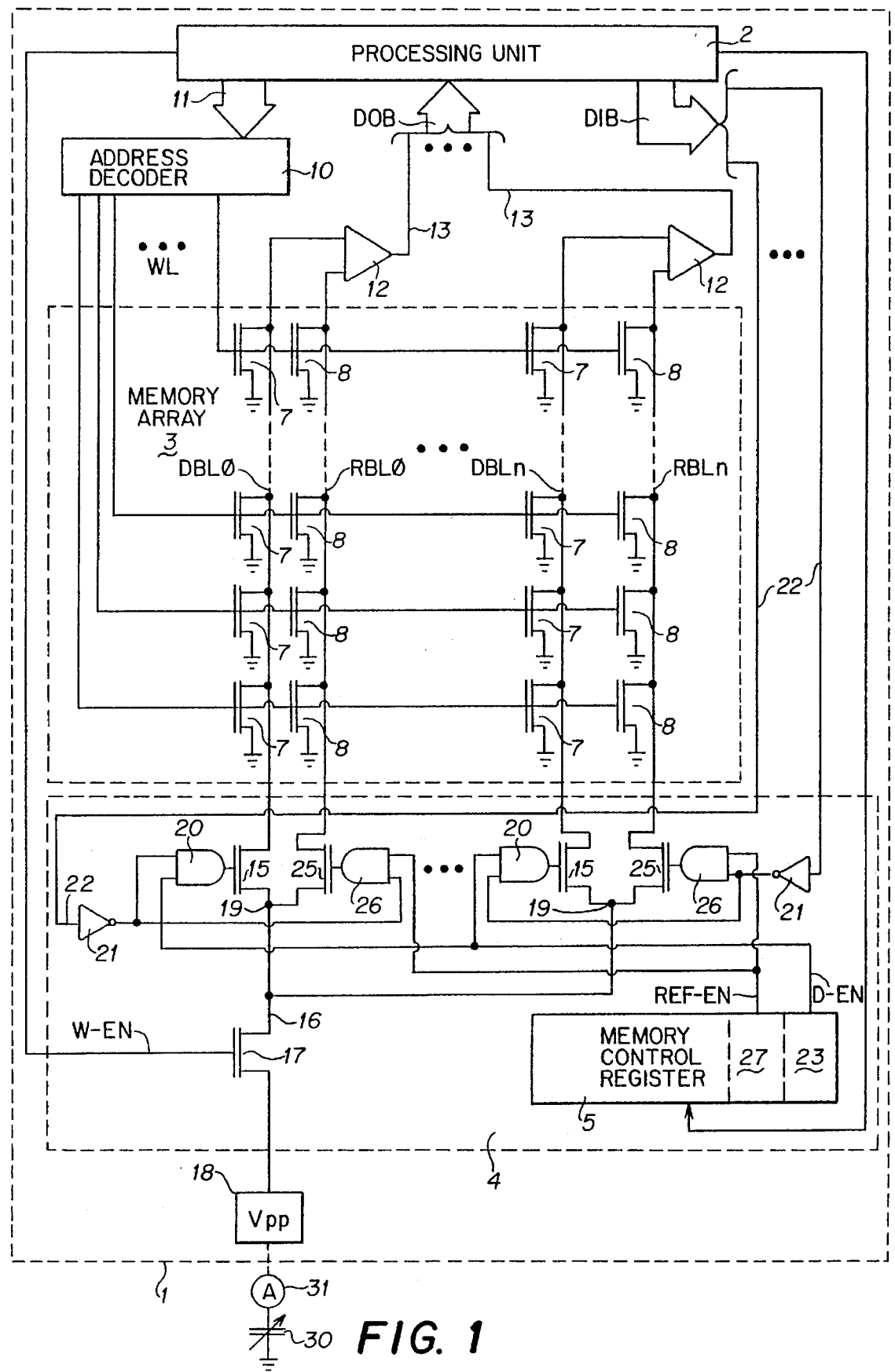
FIG. 1 is a block diagram of the architecture of a microcontroller according to a first embodiment of the present invention.

In FIG. 1, microcontroller 1 has a microcontroller processing unit 2; a memory array 3; and a memory address, supply, and control logic unit 4 including a memory control register 5.

Processing unit 2 may be of any known configuration. Memory array 3 is a nonvolatile EPROM, EEPROM, or flash-EEPROM, and has a number of pairs of cells 7, 8 which are arranged in rows and columns and which are connected to respective word lines WL and bit lines DBL, RBL. Word lines WL are connected to an address decoder 10 which, in turn, is connected to processing unit 2 over an address bus 11. The bit lines include a number of data bit lines DBL0 ... DBLn and a number of reference bit lines RBL0 ... RBLm connected to one another and respectively to cells 7 (each of which holds an elementary item or bit) and to cells 8 constituting the reference cells and generally including virgin cells, i.e., which have never been written or erased. As is known, each cell 7, 8 has a control gate terminal connected to a respective word line WL; a drain terminal connected to a respective data or reference bit line DBL, RBL; and a source terminal grounded.

Each DBL, RBL pair is connected at one end to a sensing amplifier 12, the output of which is connected to data output line 13 of a data output bus DOB connected to processing unit 2. The other end of each pair of bit lines DBL, RBL is connected to logic unit 4. More specifically, each data bit line DBL is connected to one terminal of a pass transistor 15.

Another terminal of transistor 15 defines a node 19 which is connected, via supply line 16 and a switch 17 formed by a MOS transistor, to a pin 18 supplied with programming voltage $V_{pp}$. The control terminal of the transistor switch 17 is connected to processing unit 2 over a write enable line W-EN.

The control terminal of pass transistor 15 is connected to the output of a two-input AND circuit 20 having one input connected to a data enable line D-EN, and the other input connected, via an inverter 21, to line 22, of a data input bus DIB. Data enable line D-EN is connected to control register 5, which determines the logic level of the signal on data enable line D-EN on the basis of the content of a cell 23; while data input bus DIB is connected to processing unit 2.

Each reference bit line RBL is connected to a terminal of a respective pass transistor 25, the other terminal of which is connected to node 19 and, hence, to supply line 16. The control terminal of pass transistor 25 is connected to the output of a two-input AND circuit 26 having one input connected to the output of inverter 21, and the other connected to a reference enable line REF-EN connected to a cell 27 of control register 5.

A programmable voltage source 30, and an ammeter or other current measuring element 31, are both external to microcontroller 1 and connected to pin 18 as explained below.

To measure the current of cells 7, 8 when checking or engineering microcontroller 1, logic unit 4 which is already provided for programming cells 7 is substantially used. The logic unit includes a cell 27 in control register 5, pass transistor 25 and AND circuit 26, for enabling measurement of the reference cell current.

Programming a memory word, i.e., a group of cells 7 connected to the same word line WL, requires first erasing all the word cells (i.e., storing a logic "1") and then writing a logic "0" in the word cells specified by data input bus DIB and bit lines DBL by applying a high voltage (e.g., 5.5 V–7 V) to the drain terminal of the cells.

The current of a specific cell is measured the same way, except that the voltage applied to the drain terminal of the cell for measurement is much lower than the programming voltage, typically 1 V. A cell is thus measured by writing the data cell or reference cell read bit into cells 23, 27 of control register 5; selecting a given pair of cells by means of the word lines and the data input bus; applying 1 V to programming pin 18; and performing a write instruction (thus generating a high logic level on line W-EN and turning on transistor 17. For example, the data cell corresponding to bit of an 8-bit word of address 2412 is read by writing the data cell enabling bit (logic "1") into cell 23 of control register 5, writing the disabling bit ("0") into cell 27, applying 1 V to pin 18 (by appropriately regulating source 30), and performing a write instruction with address 2412 and data 01111111. As a result, the cells connected to the word line of address 2412 are enabled; line 22 relative to the first bit provides a logic "0" which, inverted by inverter 21, results in a logic "1" at one input of AND circuit 20 driving pass transistor 15 connected to data bit line DBL0; the other input of AND circuit 20 is high, by virtue of being connected to data enable line D-EN connected to register 5; transistor 15 connected to DBL0 is on, thus enabling DBL0 to be supplied with 1 V; and the selected cell is supplied with current measurable by ammeter 31.

The reference cell with the same address indicated above is read in exactly the same way, except for the cell of control register 5. In this case, a logic "1" is stored in cell 27 as opposed to 23 to enable reference enable line REF-EN, AND circuit 26, and pass transistor 25.

Figure 2:
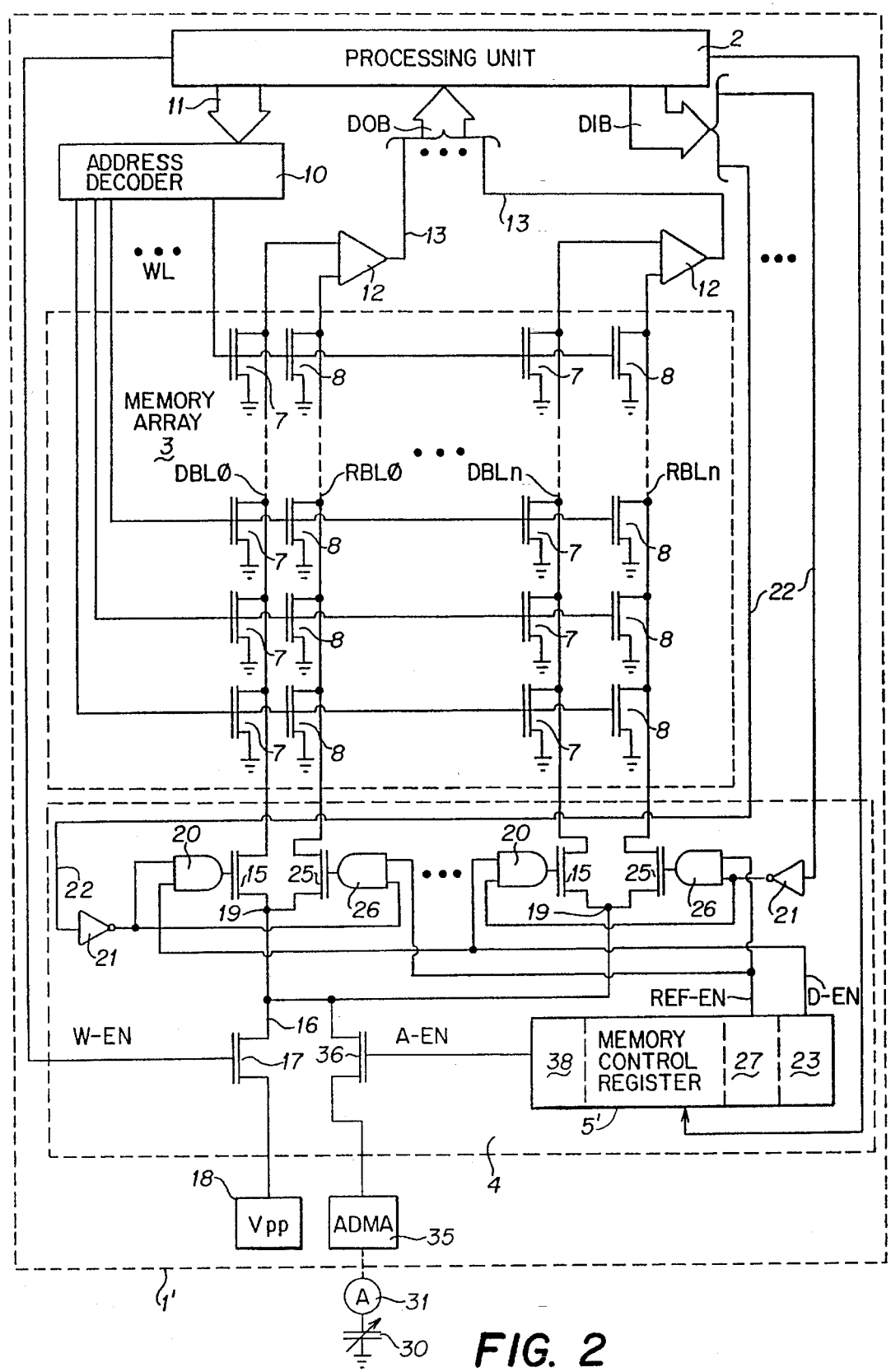
FIG. 2 is a block diagram of a microcontroller according to a second embodiment of the present invention.

If $V_{pp}$ pin 18 cannot be used, e.g., because it is already being used as a reset pin, the configuration of FIG. 1 may be modified as shown in FIG. 2.

Microcontroller 1' in FIG. 2 is substantially the same as 1 in FIG. 1, so that any parts common to both are indicated using the same numbering system and with no further description.

Microcontroller 1' has a further ADMA (Analog Direct Memory Access) pin 35 connected to programmable voltage source 30 and ammeter 31, and also to supply line 16 via a controlled switch 36 formed by a MOS transistor. The control terminal of the MOS transistor switch 36 is connected over a read enable line A-EN to a cell 38 of control register 5' Except for the addition of read enable cell 38, control register 5' is the same as 5 in FIG. 1.

The cell current of memory array 3 of microcontroller 1' is read in the same way as already described with reference to FIG. 1, except that, when the data cell or reference cell read bit is written in cells 23, 27, ADMA read enable cell 38 is also written. Consequently, when 1 V is applied to pin 35 (as opposed to 18), and a write operation is performed at the specified address, the required cell is read via ammeter 31.

The advantages of the method according to the present invention will be clear from the foregoing description. In particular, it provides for reading the cells of memories forming part of a microcontroller, and for checking the cells as formerly possible only for cells of single memories. The reading does not require the addition of a large number of pins. In the worst possible case in which none of the pins on the integrated device is available for performing the read function, only one additional pin (ADMA pin 35) is required. Also, very little additional space is required to implement the read function, which simply involves the possible addition of a dedicated ADMA pin and an ADMA enabling cell, and the addition of reference bit line pass transistor 25 and reference cell selection cell 27. Finally, the method according to the present invention involves no substantial change in the existing procedures of the microcontroller, since direct reading of the current involves substantially no more than a write operation preceded simply by setting the ADMA enable and data or reference cell read enable bits, which may be performed as part of other microcontroller instructions.

To those skilled in the art it will be clear that changes may be made to the method and architecture described and illustrated herein without departing from the scope of the present invention as defined by the appended claims. In particular, in the event an additional pin is provided or, if programming pin $V_{PP}$ is not employed for performing the current reading function, control register 5' as shown may be replaced a more complex stage comprising a register for storing only two direct reading bits (in addition to the bits required for other memory 3 functions), and a logic unit, e.g. including a multiplexer, for ADMA read enabling, and enabling the data or reference cell relative to the same memory word bit.

Moreover, the voltage applied to the gate terminal of the cells for reading may even be lower than the write voltage, for example equal to supply voltage $V_{CC}$ of the microcontroller, in which case, depending on whether a write instruction or direct reading is to be performed, processing unit 2 (which, in the configurations shown incorporates the write control logic) applies write voltage $V_{PP}$ (e.g. 12 V) Or the direct reading voltage (e.g. supply voltage $V_{CC}$=5 V).

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A method of reading the current of memory cells in a memory array on a microcontroller chip, the method comprising the steps of:

supplying a low voltage to a programming voltage supply line of the memory array on the microcontroller chip, the low voltage being insufficient to write to a memory cell;

performing a write operation to a selected cell of the memory array; and measuring current flow through the selected cell.

2. The method of claim 1, wherein the memory array has a cell enable line, the method further comprising a step of enabling the cell enable line to the performing step.

3. The method of claim 2, wherein the memory cells include data cells and reference cells, and wherein the step of enabling the cell enable line includes a step of generating a control signal for selectively enabling a data enabling line and a reference enabling line.

4. The method of claim 1 wherein the microcontroller has a programming pin, wherein the supplying step includes a step of supplying a low voltage to the programming pin;

the performing step includes a step of enabling a write switch located between the programming pin and the programming voltage supply line; and the measuring step includes a step of measuring current flow through the programming pin.

5. The method of claim 1 wherein the microcontroller has an external connecting pin and a direct reading switch located between the external connecting pin and the programming voltage supply line, wherein the supplying step includes a step of supplying a low voltage to the external connecting pin;

the performing step includes a step of enabling the direct reading switch; and the measuring step includes a step of measuring current flow through the external connecting pin.

6. The method of claim 1 wherein the supplying step includes a step of supplying a low voltage of about 1 volt.

7. A microcontroller including:

a programming voltage supply line;

a memory array having a number of memory cells coupled to the programing voltage supply line;

means for writing to predetermined cells of the memory; and means for supplying a low voltage to the programing voltage supply line and for detecting current flow in a selected memory cell of the microcontroller, the low voltage being insufficient to write to the cell.

8. The microcontroller of claim 7, wherein the memory array has data cells and reference cells connected to respective data bit lines and reference bit lines, and is connected to a memory control logic unit, the microcontroller further comprising:

a data input line;

a data cell read enable line;

a reference cell read enable line;

a reference pass transistor coupled intermediate the programming voltage supply line and one of the reference bit lines; and a logic circuit having its output connected to a control terminal of the pass transistor, a first input connected to the reference cell read enable line, and a second input connected to the data input line;

wherein the memory control logic unit includes storage elements, coupled to the data cell read enable line and the reference cell read enable line, for storing enabling data for the data cell read enable line and the reference cell read enable line.

9. The microcontroller of claim 7, wherein the voltage supply means includes a programming pin.

10. The microcontroller of claim 7, wherein the voltage supply means includes an external connecting pin.

11. The microcontroller of claim 10, further comprising a direct read enable switch interposed between the external connecting pin and the programming voltage supply line, wherein the memory control logic unit includes a storage element connected to the direct read enable switch.

12. A microcontroller comprising:

a processing unit;

a memory array having a number of memory cells arranged in rows and columns;

a plurality of data bit lines coupled to the memory array along the columns;

a programming voltage supply line coupled to the data bit lines;

an address decoder, coupled to receive inputs from the processing unit, having word lines coupled to the rows of the memory array for selectively enabling rows;

a data input bus, coupled to the processing unit and to the programming voltage supply line, for selectively enabling columns; and a pin, coupled to the programming voltage supply line, for coupling a low voltage source and a current detector to the programming voltage supply line, the current detector for measuring the current when the pin is coupled to the low voltage supply, the low voltage being sufficiently low to be insufficient to write to a cell.

13. The microcontroller of claim 12, wherein the pin is a dedicated pin, the microcontroller further comprising a switch intermediate the dedicated pin and the programming voltage supply line.

14. The microcontroller of claim 12, further comprising a switch intermediate the pin and the programming voltage supply line, the switch being selectively activated by a write enable signal from the processing unit.

15. A method of testing a microcontroller chip having a processing unit, an address decoder, a memory array having memory cells, and a programming voltage supply line coupled to the memory cells, the method comprising the steps of:

supplying a low voltage to the programming voltage supply line of the microcontroller, the low voltage being insufficient to write to a memory cell;

selecting a cell of the array;

coupling the low voltage to the cell; and measuring an electrical current in the selected cell.

16. The method of claim 15, wherein the step of selecting includes selecting one of a data cell and a reference cell.

17. The method of claim 15, wherein the supplying step includes a step of supplying a low voltage to a programing pin of the microcontroller, and the measuring step includes a step of measuring an electrical current through the programing pin.

18. The method of claim 15, wherein:

the supplying step includes a step of supplying a low voltage to an external connecting pin of the microcontroller;

the coupling step includes a step of enabling a direct reading switch of the microcontroller; and the measuring step includes a step of measuring current flow through the external connecting pin.

19. The method of claim 15, further comprising a step of selecting a write mode of the memory array prior to the coupling step.

20. The method of claim 17, wherein the step of selecting includes selecting one of a data cell and a reference cell.

21. The method of claim 18, wherein the step of selecting includes selecting one of a data cell and a reference cell.

22. The method of claim 20, further comprising a step of selecting a write mode of the memory array prior to the coupling step.

23. The method of claim 21, further comprising a step of selecting a write mode of the memory array prior to the coupling step.

24. A microcontroller including:

a processing unit;

a memory array having memory cells;

an address decoder, coupled to the processing unit and the memory array, that receives an address from the processing unit and selects a memory cell corresponding to the address from the memory array; and means for coupling a low voltage source and a current detector to the memory cell selected by the address decoder, a low voltage from the voltage source being insufficient to write to the memory cell.

25. The microcontroller of claim 24, wherein the memory cells include data cells and reference cells.

26. The microcontroller of claim 25, wherein the means for coupling includes a programing pin and a programming voltage supply line.

27. The microcontroller of claim 25, wherein the means for coupling includes:

an external connecting pin;

a switch having a first terminal coupled to the external connecting pin, a control terminal, and a second terminal;

a programing voltage supply line that couples the second terminal of the switch to the memory cell; and wherein the control terminal of the switch receives a control signal from the means for coupling, the switch in response to the control signal coupling the low voltage source and the current detector through the external connecting pin to the memory cell.

28. The microcontroller of claim 24, wherein the means for coupling includes a programming pin and a programming voltage supply line.

29. The microcontroller of claim 24, wherein the means for coupling includes:

an external connecting pin;

a switch having a first terminal coupled to the external connecting pin, a control terminal, and a second terminal; and a programing voltage supply line that couples the second terminal of the switch to the memory cell;

wherein the control terminal of the switch receives a control signal from the means for coupling, the switch in response to the control signal coupling the low voltage source and the current detector through the external connecting pin to the memory cell.

* * * * *